(12) United States Patent
Iwabuchi et al.

(10) Patent No.: US 9,153,682 B2
(45) Date of Patent: Oct. 6, 2015

(54) SEMICONDUCTOR DEVICE

(71) Applicant: SANKEN ELECTRIC CO., LTD., Niiza (JP)

(72) Inventors: Akio Iwabuchi, Niiza (JP); Hironori Aoki, Niiza (JP)

(73) Assignee: SANKEN ELECTRIC CO., LTD., Saitama (JP)

( * ) Notice: Subject to any disclaimer, the term of this patent is extended or adjusted under 35 U.S.C. 154(b) by 159 days.

(21) Appl. No.: 13/962,899

(22) Filed: Aug. 8, 2013

(65) Prior Publication Data

US 2013/0328107 A1 Dec. 12, 2013

Related U.S. Application Data

(63) Continuation of application No. 13/243,600, filed on Sep. 23, 2011, now abandoned.

(30) Foreign Application Priority Data

Jul. 6, 2010 (JP) .................................. 2010-153744

(51) Int. Cl.
*H01L 29/06* (2006.01)
*H01L 29/778* (2006.01)
(Continued)

(52) U.S. Cl.
CPC .............. *H01L 29/778* (2013.01); *B82Y 10/00* (2013.01); *H01L 29/0657* (2013.01); *H01L 29/207* (2013.01); *H01L 29/42316* (2013.01); *H01L 29/7787* (2013.01); *H01L 29/2003* (2013.01)

(58) Field of Classification Search
CPC .................................................... H01L 29/778
USPC ............................................................ 257/12
See application file for complete search history.

(56) References Cited

U.S. PATENT DOCUMENTS

2005/0189559 A1 9/2005 Saito et al.
2006/0022218 A1* 2/2006 Masumoto et al. ........... 257/192
(Continued)

FOREIGN PATENT DOCUMENTS

JP 3456054 B2 10/2003
JP 2005-93696 A 4/2005
(Continued)

OTHER PUBLICATIONS

L. Yuan, M. J. Wang, and K. J. Chen, Fluorine plasma ion implantation in AIGaN/GaN heterostructures: A molecular dynamics simulation study, Appl. Phys. Lett. 92, 102109 (2008).*
(Continued)

*Primary Examiner* — Mark Tornow
(74) *Attorney, Agent, or Firm* — Birch, Stewart, Kolasch & Birch, LLP

(57) ABSTRACT

A semiconductor device protects against concentration of electric current at a front end portion of one of the electrodes thereof. The semiconductor device includes a substrate, a compound semiconductor layer formed on the substrate and having a channel layer based on a hetero junction, a first main electrode formed on the compound semiconductor layer, a second main electrode formed on the compound semiconductor surrounding the first main electrode and having a linear region and an arc-shaped region, a control electrode formed on the compound semiconductor layer and disposed opposite to the first main electrode and the second main electrode, an electric current being made to flow between the first main electrode and the second main electrode, and an electric current limiting section formed between the first main electrode and the arc-shaped region of the second main electrode.

20 Claims, 9 Drawing Sheets

(51) Int. Cl.
  *B82Y 10/00* (2011.01)
  *H01L 29/207* (2006.01)
  *H01L 29/423* (2006.01)
  *H01L 29/20* (2006.01)

(56) References Cited

U.S. PATENT DOCUMENTS

2006/0060871 A1* 3/2006 Beach .............................. 257/94
2006/0220065 A1  10/2006 Kawasaki et al.
2009/0200576 A1   8/2009 Saito et al.
2010/0096667 A1*  4/2010 Nakajima et al. ............. 257/194

FOREIGN PATENT DOCUMENTS

| JP | 2005-244072 A | 9/2005 |
| JP | 2006-66887 A | 3/2006 |
| JP | 2006-286740 A | 10/2006 |
| JP | 2007-294872 A | 11/2007 |
| JP | 2009-60049 A | 3/2009 |
| JP | 2009-218566 A | 9/2009 |
| JP | 2010-45073 A | 2/2010 |

OTHER PUBLICATIONS

English Machine translation of JP-2009-060049.*
English Machine Translation of JP 2009-060049.
L. Yuan, M.J. Wang, and K. J. Chen, Fluorine Plasma Ion Implantation in AlGaN/GaN heterostructures: A Molecular Dynamics Simulation Study, Appl. Phys. Lett. 92, 102109 (2008).

* cited by examiner (a)

(b)

SEMICONDUCTOR DEVICE

This application is a Continuation of co-pending application Ser. No. 13/243,600, filed on Sep. 23, 2011, under 35 U.S.C. §120, application Ser. No. 13/243,600 claims the benefit of priority to JP 2010-153744, filed in Japan on Jul. 6, 2010, the entire contents of which are hereby incorporated by reference.

BACKGROUND OF THE INVENTION

1. Field of the Invention

The present invention relates to a semiconductor device. More particularly, the present invention relates to a semiconductor device equipped with an electrode having an arc-shaped part.

2. Description of the Related Art

Nitride-based compound semiconductors such as gallium nitride-based ones are expected to find applications in the field of low loss and high power devices with high breakdown voltage because they have a high breakdown electric field. Nitride-based compound semiconductor devices having a finger type electrode structure have been disclosed in recent years (See, for example, Patent Document 1).

CITATION LIST

Patent Document

Patent Document 1: Jpn. Pat. Appln. Laid-Open Publication No. 2009-60049

In semiconductor devices having a finger type electrode structure, the electrode structure includes a linear part and an arc-shaped part linked to the linear part. When an electrode having an arc-shaped part is employed, there arises a problem of concentration of electric current at a front end portion of the electrode. This phenomenon will be described below by referring to FIG. 12. FIG. 12 is a schematic plan view of a part of the electrode section having an arc-shaped part of a nitride semiconductor-based high electron mobility transistor (GaN-HEMT) when an electric current is made to flow through the transistor. In FIG. 12, the electrode section 100 includes a source electrode 102 and a gate electrode 103, each having an arc-shaped part 101 and a drain electrode 105 having a front end portion 104. The arrows in FIG. 12 indicate how an electric current flows from the source electrode to the drain electrode. As seen from FIG. 12, the electric current flowing from the arc-shaped part 101 of the source electrode 102 to the front end portion 104 of the drain electrode 105 is concentrated at the front end portion 104. The portion of the drain electrode 105 where the electric current is concentrated shows a voltage fall greater than the portion thereof where the electric current is not concentrated so that the semiconductor device can emit heat from the former portion and ultimately be broken down.

SUMMARY OF THE INVENTION

It is desirable to provide a semiconductor device of the type under consideration that can protect the device against any breakdown attributable to concentration of electric current at a front end portion of one of the electrodes thereof having such a front end portion.

According to the present invention, a semiconductor device is configured as described below.

A semiconductor device, which is referred to as the first semiconductor device according to the present invention hereinafter, includes:

a substrate;

a compound semiconductor layer formed on the substrate and having a two-dimensional carrier gas layer based on a hetero-junction;

a first main electrode formed on the compound semiconductor layer;

a second main electrode formed on the compound semiconductor layer so as to surround the first main electrode in a plan view and having a linear region and an arc-shaped region;

a control electrode formed between the first main electrode and the second main electrode on the compound semiconductor layer;

an electric current being made to flow between the first main electrode and the second main electrode by way of the two-dimensional carrier gas layer; and an electric current limiting section for limiting the electric current from flowing between the first main electrode and the arc-shaped region of the second main electrode.

Thus, according to the present invention, an electric current limiting section is provided between the first main electrode and the arc-shaped region of the second main electrode of a semiconductor device according to the present invention so that the concentration of electric current at a front end portion of the first main electrode is alleviated and the semiconductor device is protected against any breakdown attributable to concentration of electric current.

DETAILED DESCRIPTION OF THE INVENTION

Now, the present invention will be described in greater detail by referring to the accompanying drawings that illustrate embodiments of the invention.

Figure 1:
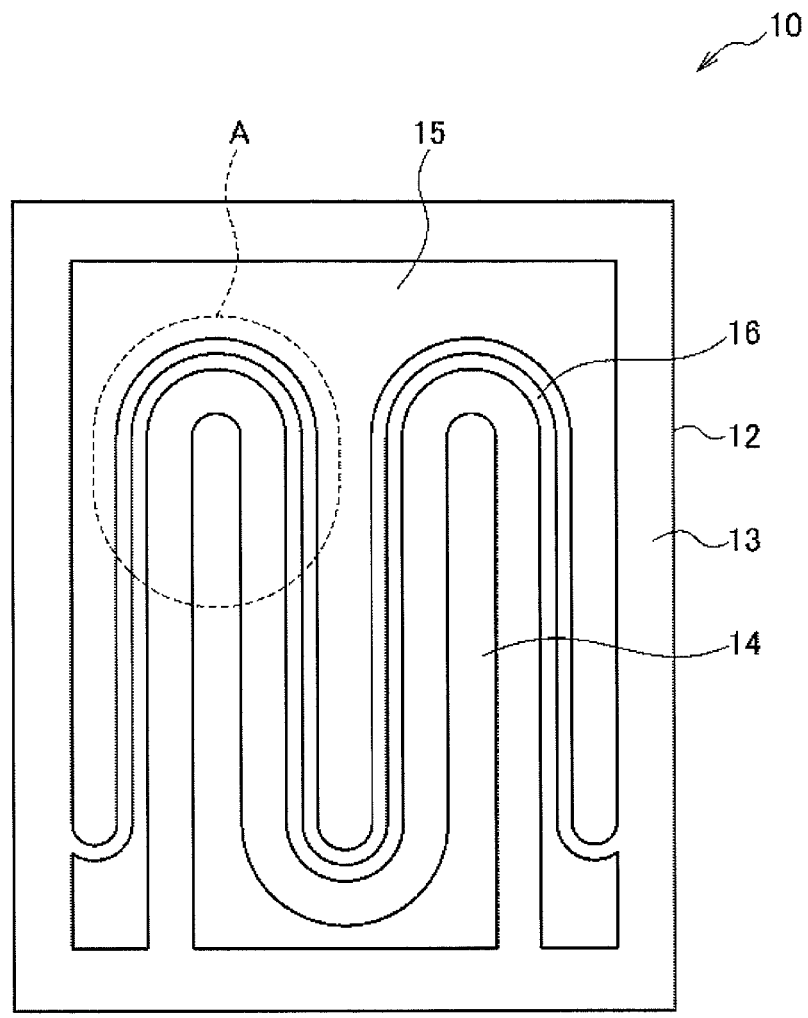
FIG. 1 is a schematic plan view of the semiconductor device according to a first embodiment of the present invention.
Figure 2:
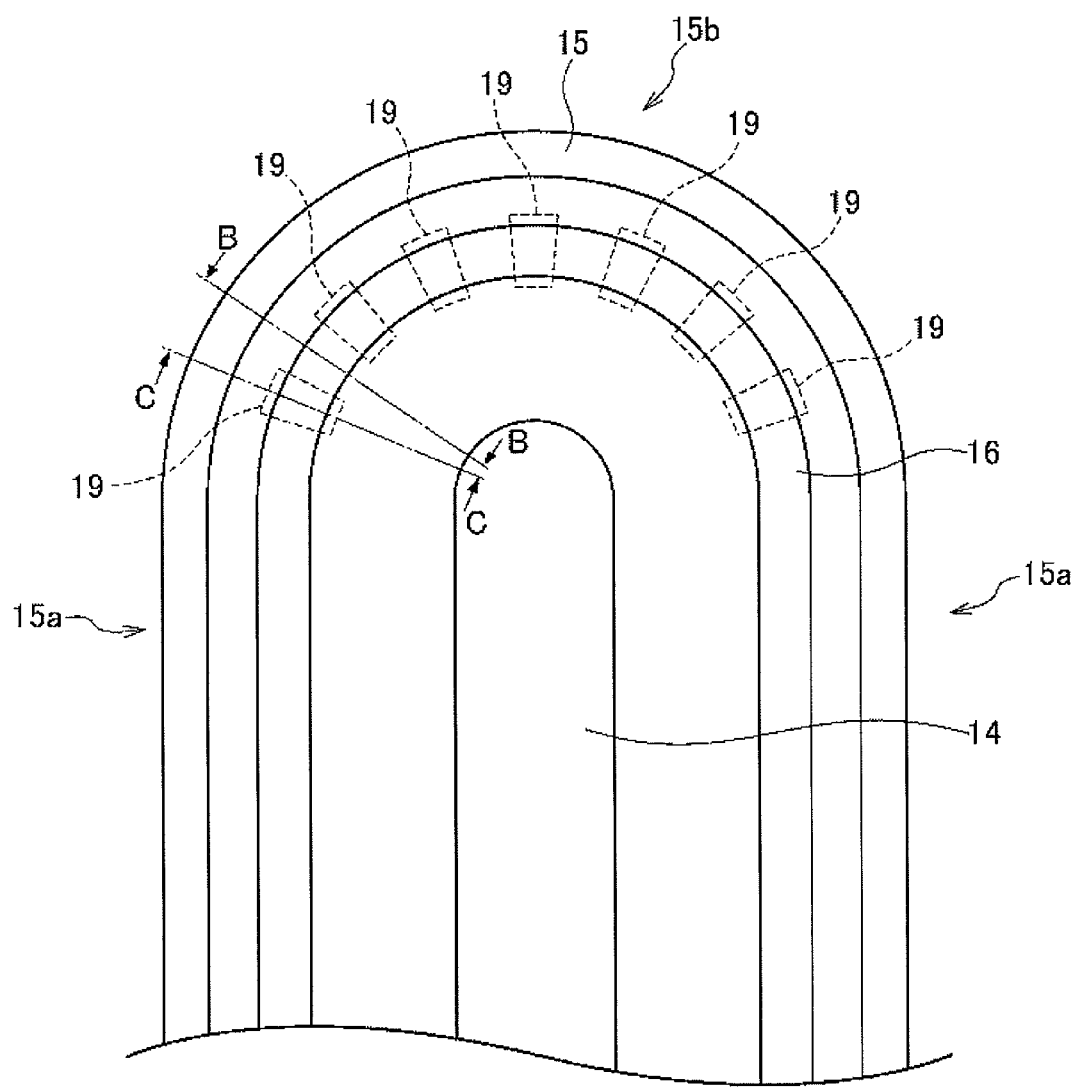
FIG. 2 is an enlarged schematic view of area A in FIG. 1.
Figure 3:
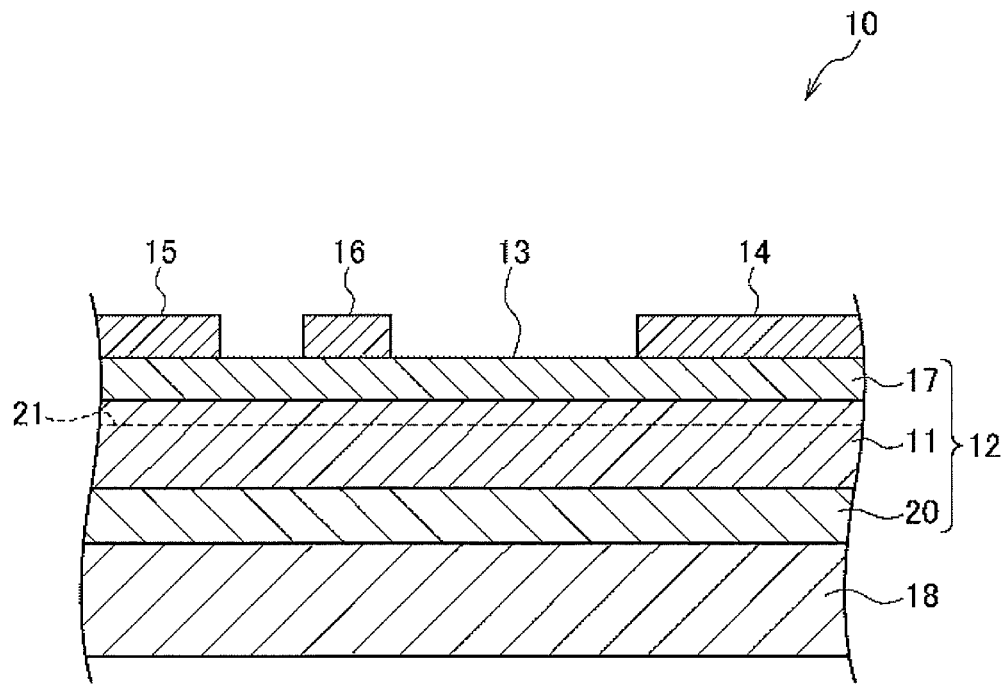
FIG. 3 is a schematic cross-sectional view taken along line B-B in FIG. 2.
Figure 4:
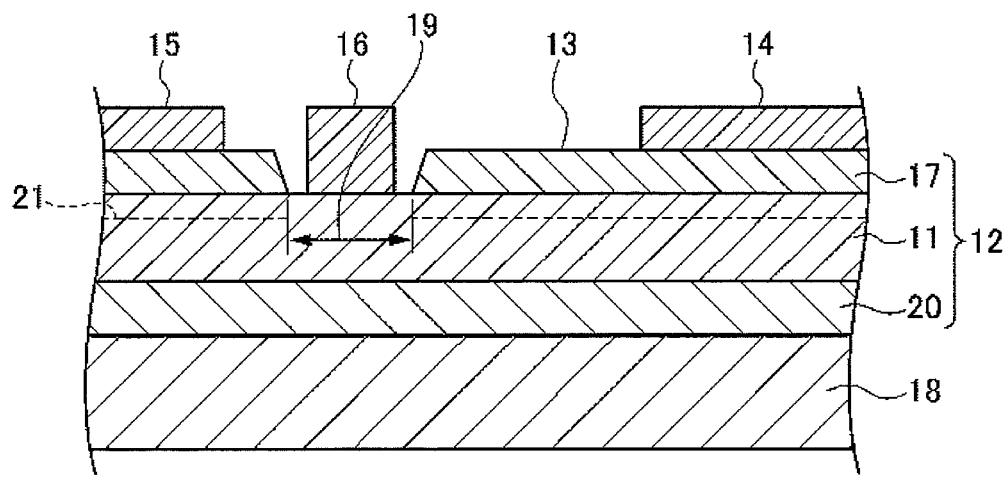
FIG. 4 is a schematic cross-sectional view taken along line C-C in FIG. 2.

The semiconductor device according to the first embodiment of the present invention will be described below by referring to FIGS. 1 through 4. FIG. 1 is a schematic plan view of the semiconductor device according to the first embodiment of the present invention. FIG. 2 is an enlarged schematic view of area A in FIG. 1. FIG. 3 is a schematic cross-sectional view taken along line B-B in FIG. 2. FIG. 4 is a schematic cross-sectional view taken along line C-C in FIG. 2.

As shown in FIGS. 1 through 4, the semiconductor device 10 according to the first embodiment of the present invention has a semiconductor layer 12 formed by a plurality of layers including a channel layer 11 made of a nitride-based compound semiconductor, a buffer layer 20 and a carrier supply layer 17, a first main electrode 14, a second main electrode 15, the first main electrode 14 and the second main electrode 15 being formed on the main surface 13 of the semiconductor layer 12, and a control electrode 16 arranged between the first main electrode 14 and the second main electrode 15 on the main surface 13. The control electrode (gate electrode) 16 controls the principal current that flows between the first main electrode 14 and the second main electrode 15 through the channel layer 11. In the following description, it is assumed that the first main electrode 14 is a drain electrode 14 and the second main electrode 15 is a source electrode 15. Alternatively, however, it may be so assumed that the first main electrode 14 is a source electrode and the second main electrode 15 is a drain electrode. In any case, a semiconductor device according to the present invention will be described in terms of a first main electrode, a second main electrode and a control electrode.

As shown in FIG. 1, the second main electrode 15 and the first main electrode 14 are comb-shaped with their plural teeth extending vertically on the sheet of FIG. 1. The third electrode 16 is arranged between the second main electrode 15 and the first main electrode 14.

The second main electrode 15 and the first main electrode 14 that are arranged on the semiconductor layer 12 make an ohmic contact (low resistance contact) with the electron supply layer (carrier supply layer) 17. The second main electrode 15 and the first main electrode 14 may be formed as laminates of titanium (Ti) and aluminum (Al).

The control electrode 16 may be a metal film that is a laminate of, for example, nickel (Ni), gold (Au) and titanium (Ti) and make a Shottky contact with the carrier supply layer 17. The control electrode 16 may alternatively be formed by using a material that makes a Schottky contact with nitride-based compound semiconductors. Examples of such a material include Ni, platinum (Pt), palladium (Pd), rhodium (Rh) and copper (Cu).

As shown in FIG. 3, the semiconductor layer 12 that is formed by a plural layers including a buffer layer 20, a channel layer 11 and a carrier supply layer 17 is arranged on a substrate 18. The substrate 18 is preferably a silicon substrate that can be made to show a large diameter in order to manufacture nitride-based compound semiconductor devices at low cost. An impurity may be doped to the silicon substrate to make the substrate a conductive substrate. Alternatively, the substrate 18 may be a ceramic semiconductor substrate or an SiC substrate. Still alternatively, the substrate 18 may be made of a material selected from silicon carbide, sapphire, spinel, ZnO, gallium nitride, aluminum nitride or some other material on which a III-group nitride material can grow.

FIG. 2 is an enlarged schematic view of area A in FIG. 1. The semiconductor device 10 has a substrate 18, a compound semiconductor layer (semiconductor layer) 12 that includes a channel layer 11 formed on the substrate 18 and based on a hetero junction, a first main electrode 14 formed on the compound semiconductor layer 12, a second main electrode 15 formed on the compound semiconductor layer 12 so as to surround the first main electrode 14 and including a linear region 15a and an arc-shaped region 15b, and a control electrode 16 formed on the compound semiconductor layer 12 between the first main electrode 14 and the second main electrode 15. In the semiconductor device 10, an electric current is made to flow between the first main electrode 14 and the second main electrode 15. An electric current limiting section 19 is provided between the first main electrode 14 and the arc-shaped region 15b of the second main electrode 15 to limit the electric current flowing between them.

With the above-described arrangement, the electric current limiting section 19 is preferably a part between the first main electrode 14 and the arc-shaped region 15b of the second main electrode 15 where the two-dimensional carrier gas layer is partially removed. More specifically, the electric current limiting section 19 is a part where the two-dimensional carrier gas layer 21 is removed by partially removing the carrier supply layer 17 between the first main electrode 14 and the arc-shaped region 15b of the second main electrode 15 by means of recess etching. More specifically, the electric current limiting section 19 may be a part where the two-dimensional carrier gas layer 21 is partially removed in an area located right under the control electrode between the first main electrode 14 and the arc-shaped region 15b of the second main electrode 15.

FIG. 3 is a schematic cross-sectional view taken along line B-B in FIG. 2. The semiconductor layer 12 shown in FIG. 3 has a structure formed by sequentially laying a buffer layer 20, a channel layer 11 and a carrier supply layer 17, each of which is made of a nitride-based compound semiconductor, in the above-described order. In the following description, the carriers supplied to the channel layer 11 by the carrier supply layer 17 are assumed to be electrons. In other words, the two-dimensional carrier gas layer 21 is a two-dimensional electron gas layer (to be referred to as 2 DEG layer hereinafter) and electrons flows from the source electrode 15 to the drain electrode 14 by way of the 2 DEG layer 21.

The buffer layer 20 is produced on the substrate 18 to alleviate the lattice mismatch, if any, between the substrate 18 and the channel layer 11, although the buffer layer 20 may be omitted.

The channel layer 11 arranged on the buffer layer 20 is a layer for obtaining the 2 DEG layer 21 as a current path (channel) located near the hetero-junction interface with the carrier supply layer 17. The channel layer 11 is typically formed by epitaxial growth of undoped GaN, which is free from any impurity, to a thickness of about 0.5 to 10 µm by way of a MOCVD process. An appropriate channel layer 11 can be formed by using an III-group nitride material such as $Al_{y1}Ga_{y2}In_{(1-y1-y2)}N$ ($0 \le y1 < 1$, $0 \le y2 \le 1$, $y1+y2 \le 1$). In this embodiment, the channel layer 11 is formed as a non-doped GaN layer having a film thickness of about 5 to 6 µm. The channel layer 11 can be formed on the buffer layer 20 by means of a known semiconductor growth process such as a metalorganic vapor phase epitaxy (MOVPE) process or a molecular beam epitaxy (MBE) process.

The carrier supply layer 17 arranged on the channel layer 11 is made of a nitride semiconductor showing a band gap greater than the channel layer 11 and having a lattice constant different from the channel layer 11. The carrier supply layer 17 is expressed by $Al_xM_yGa_{1-x-y}N$ ($0 \le x < 1$, $0 \le y < 1$, $0 \le x+y \le 1$), where M is indium (In) or boron (B). X in the composition ratio is preferably 0.1 to 0.5 and more preferably 0.3. While undoped $Al_xGa_{1-x}N$ can be adopted for the carrier supply layer 17, a nitride semiconductor made of $Al_xGa_{1-x}N$ to which an n-type impurity is added can also be adopted for the carrier supply layer 17.

The carrier supply layer 17 is formed on the channel layer 11 by way of an epitaxial growth process such as a MOCVD process. The film thickness of the carrier supply layer 17 is so selected as to produce a known 2 DEG layer 21 on the basis of a hetero junction between the channel layer 11 and the carrier supply layer 17. Specifically, the film thickness of the carrier supply layer 17 is preferably about 5 to 50 nm, which is thinner than the channel layer 11, and more preferably about 5 to 30 nm.

Alternatively, $Al_xGa_{1-x}N$ to which an n-type impurity is doped may be adopted for the carrier supply layer 17. A spacer layer made of undoped AlN may be arranged between the carrier supply layer 17 and the channel layer 11 made of GaN. A contact layer typically made of n-type AlGaN may be arranged between the source electrode 15 and the drain electrode 14, and the carrier supply layer 17. The carrier supply layer 17 can be formed on the channel layer 11 by way of a known semiconductor growth process such as a metalorganic vapor phase epitaxy (MOVPE) process or a molecular beam epitaxy (MBE) process.

FIG. 4 is a schematic cross-sectional view taken along line C-C in FIG. 2. The cross-sectional view taken along line C-C differs from the cross-sectional view taken along line B-B in that a part formed by partially removing the carrier supply layer 17 between the first main electrode 14 and the arc-shaped region 15b of the second main electrode 15 is arranged. The part formed by removing the carrier supply layer 17 operates as an electric current limiting section 19. No electric current flows through the electric current limiting section 19 because a two-dimensional carrier gas (2 DEG) layer is not formed there. More specifically, the electric current limiting section 19 is formed by partially removing the carrier supply layer 17 between the first main electrode 14 and the arc-shaped region 15b of the second main electrode 15 by means of recess etching. The electric current limiting section 19 may be formed by partially removing the carrier supply layer located right under the control electrode 16 between the first main electrode 14 and the arc-shaped region 15b of the second main electrode 15. Otherwise, the cross-sectional view taken along line C-C is same as the cross-sectional view taken along line B-B.

Figure 5A:
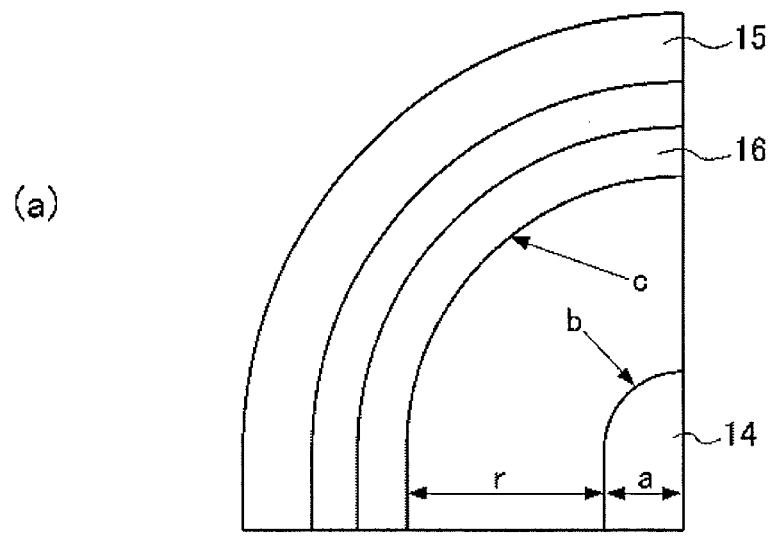
FIGS. 5A and 5B are schematic views of the semiconductor device according to the first embodiment of the present invention, illustrating the dimensions of the electric current limiting section thereof.
Figure 5B:
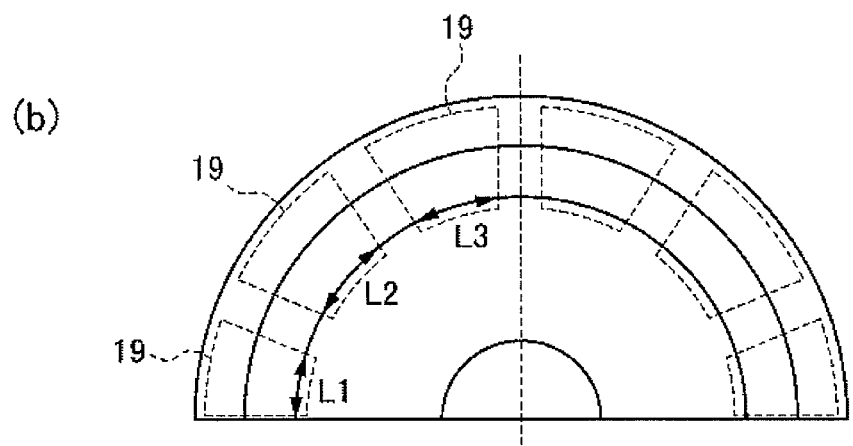

FIGS. 5A and 5B are schematic views, illustrating the dimensions of the electric current limiting section 19. Referring to FIG. 5A, the illustrated dimensions show relationships as described below. Assume that the width of the first main electrode 14 (the diameter of the arc-shaped part) is 2a and the peripheral length of the arc-shaped region of the first main electrode 14 is b while the peripheral length of the end section at the side of the first main electrode 14 of the arc-shaped part of the control electrode 16 is c and the distance from the end of the first main electrode 14 to the corresponding end of the control electrode 16 is r, the relationships of $b=2\pi a/4$ and $c=2\pi(a+r)/4$ hold true. With this arrangement, concentration of electric current is apt to take place because of the relationship of $b \ll c$. Concentration of electric current can be alleviated by making the relationship between b and c close to $b=c$.

In this embodiment, the relationship between b and c is made to become close to $b=c$ by forming an electric current limiting section 19 as shown in FIG. 5B. More specifically, if the total length of the parts of the end section of the control electrode 16 at the side of the first main electrode 14 from right under which 2 DEG is removed is L ($L=L1+L2+L3$ in FIG. 5B), 2 DEG is removed from right under the control electrode 16 so as to make $L=c-b=\pi r/2$ hold true. While an electric current limiting section 19 is preferably so arranged as to make the above formula hold true to be strict, the region of the electric current limiting section 19 can be appropriately selected so long as the effect of alleviating concentration of electric current is obtained.

Figure 6:
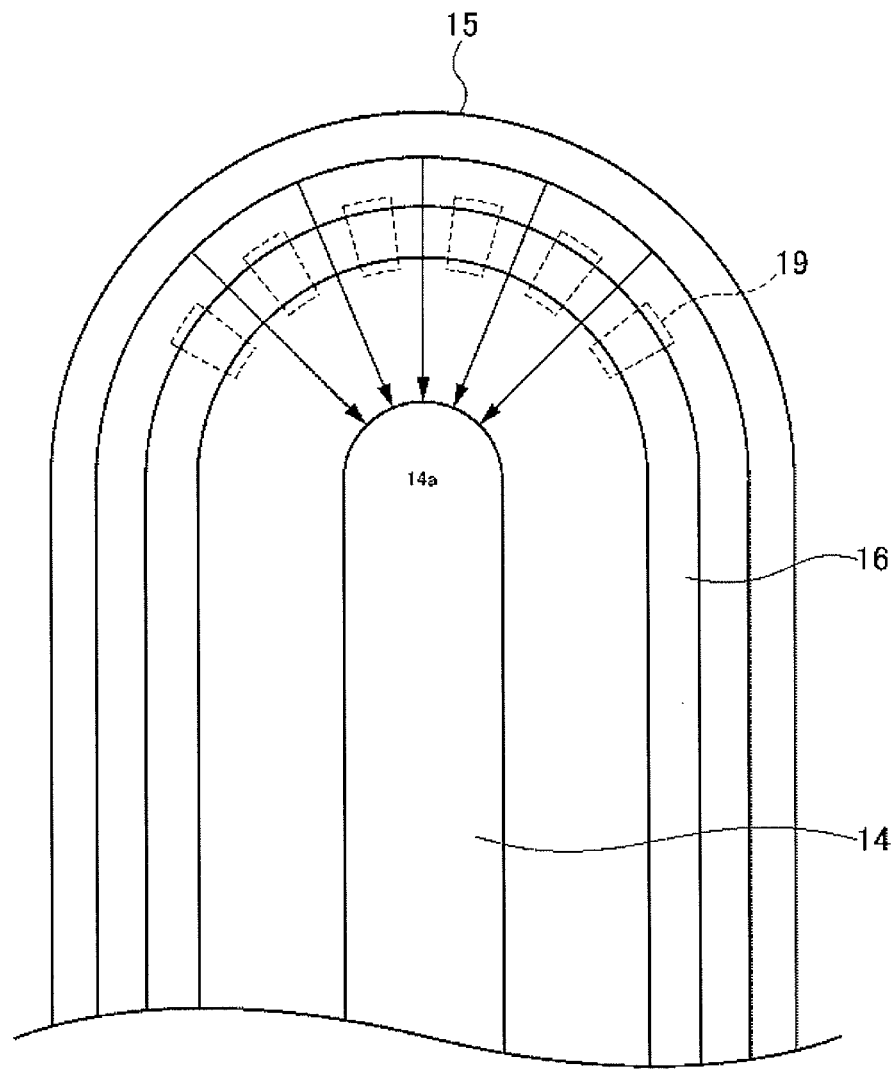
FIG. 6 is a schematic view of the semiconductor device according to the first embodiment of the present invention, illustrating the operation thereof.

Now, the operation of the semiconductor device 10 according to the first embodiment of the present invention will be described below by referring to FIG. 6. When a voltage is applied between the first main electrode 14 and the second main electrode 15, 2 DEG is formed in the region where no electric current limiting section 19 is formed so that consequently an electric current flows between the first main electrode 14 and the second main electrode 15. On the other hand, no 2 DEG 21 is formed in the electric current limiting section 19 because the carrier supply layer 17 is removed from there so that consequently no electric current flows through the electric current limiting section 19. Thus, an electric current flows only in the parts indicated by arrows in FIG. 6. As a result, concentration of electric current is suppressed at the end section of the second main electrode 15.

As described above, according to the present invention, concentration of electric current is alleviated at the front end section 14a of the first main electrode 14 because of the provision of the electric current limiting section 19 so that it is possible to provide a semiconductor device 10 that is protected against any breakdown attributable to concentration of electric current.

Now, a method of manufacturing the nitride-based compound semiconductor device according to the first embodiment of the present invention will be described below. Note, however, that the method is described below only as an example and any of various other methods including those obtained by modifying the method to be described below can be used to manufacture a nitride-based compound semiconductor device according to the present invention.

(Step 1)

Firstly, a buffer layer 2, a channel layer 11 and a carrier supply layer 17 are sequentially formed on a substrate 18 by epitaxial growth in the above-mentioned order to produce a semiconductor layer 12 as a laminate. The channel layer 11 is formed as an undoped GaN layer typically having a film thickness of 0.5 to 10 μm by way of a MOCVD process and the carrier supply layer 17 thereon is formed as an undoped AlGaN layer, which may typically be made of a nitride semiconductor showing a band gap greater than the channel layer 11 and having a lattice constant different from the channel layer 11, by way of a MOCVD process.

(Step 2)

A recess etching operation is partially conducted in areas of the carrier supply layer 17 for producing a control electrode. In other words, the carrier supply layer 17 is partially removed.

(Step 3)

Then, a first electroconductor layer is formed on the semiconductor layer 12 by way of an evaporation process to produce the second main electrode 15 and the first main electrode 14 on the semiconductor layer 12. A laminate structure of Ti and Al, for example, can be adopted for the first electroconductor layer. Thereafter, the second main electrode 15 and the first main electrode 14 are formed by wet etching the first electroconductor layer, using a patterned photoresist film as a mask, by way of a photolithography process.

(Step 4)

Subsequently, an insulating film is formed on the semiconductor layer 12, the second main electrode 15 and the first main electrode 14 and the parts of the insulating film where the control electrode 16 and the semiconductor layer contact with each other are removed by way of a photolithography process and a wet etching process to produce an aperture section.

(Step 5)

Thereafter, a second electroconductor layer is formed by way of a sputtering process in order to produce the control electrode 16. More specifically, the second electroconductor layer is so formed as to bury the aperture section of the insulating film and produce a Schottky junction between the second electroconductor layer and the semiconductor layer 12 at the aperture section, and followed by a lift-off process. The second electroconductor layer may be formed as a laminate of Ni, Au and Ti, for instance.

Modified Embodiment

Figure 7:
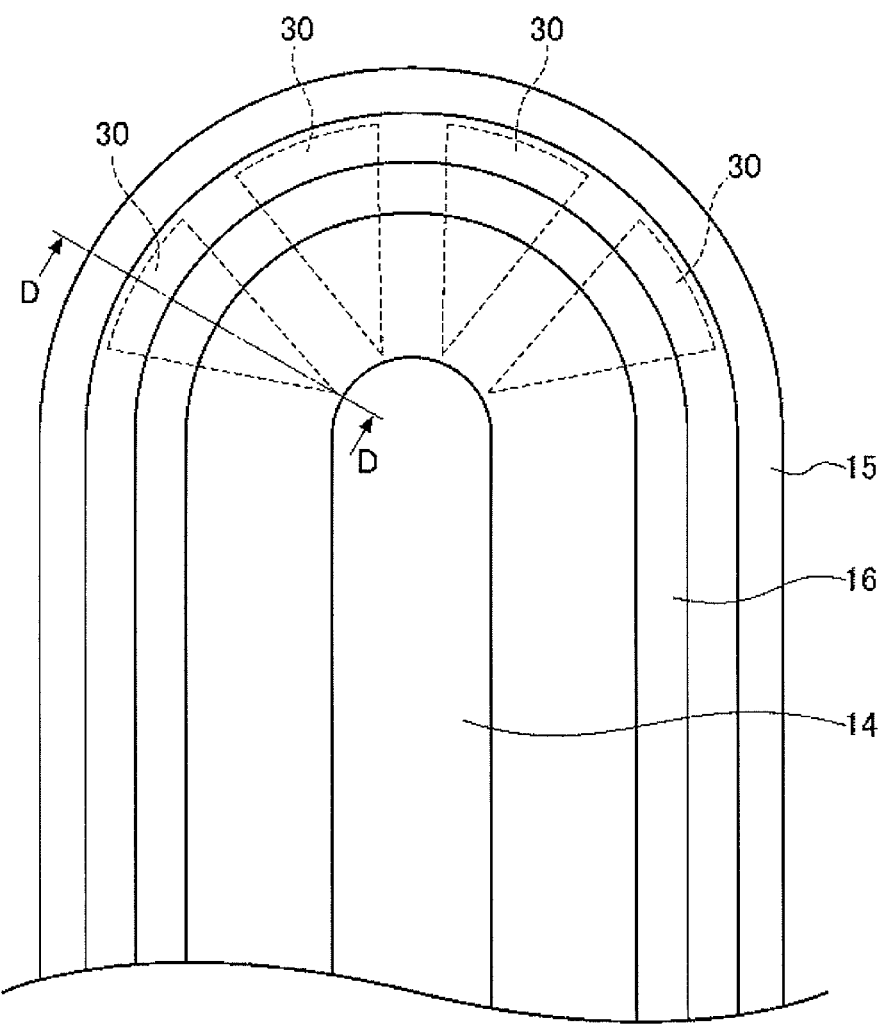
FIG. 7 is a schematic view of an embodiment formed by modifying the semiconductor device of the first embodiment.
Figure 8:
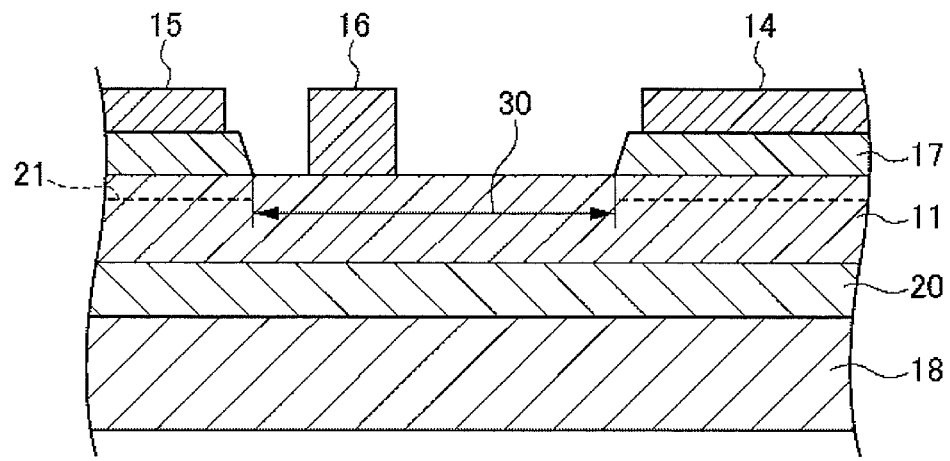
FIG. 8 is a schematic cross-sectional view taken along line D-D in FIG. 7.

FIGS. 7 and 8 schematically illustrate of an embodiment formed by modifying the semiconductor device of the first embodiment. FIG. 7 is a view that corresponds to FIG. 2 illustrating the first embodiment. FIG. 8 is a schematic cross-sectional view taken along line D-D in FIG. 7. The nitride-based compound semiconductor device illustrated in FIGS. 7 and 8 differs from the first embodiment of the present invention illustrated in FIGS. 1 through 6 in that the electric current limiting section 30 thereof is produced by removing the two-dimensional carrier gas layer 21 between the first main electrode 14 and the arc-shaped region 15b of the second main electrode 15 in a part other than and in addition to the part right under the control electrode 16. Otherwise, this modified embodiment is same as the nitride-based compound semiconductor device of the first embodiment illustrated in FIGS. 1 through 6.

For the nitride-based compound semiconductor device illustrated in FIGS. 7 and 8, the carrier supply layer 17 is partially removed by removing 2 DEG 21 in the part where the control electrode is formed by deposition and also in apart other than the former part by recess etching.

Thus, when a voltage is applied between the first main electrode 14 and the second main electrode 15 of the nitride-based compound semiconductor device formed by modifying the first embodiment of the present invention, an electric current flows between the first main electrode 14 and the second main electrode 15 because 2 DEG 21 is formed in the region where the electric current limiting section 30 is not found. On the other hand, no 2 DEG 21 is formed in the electric current limiting section 30 so that consequently no electric current flows through the electric current limiting section 30. As a result, concentration of electric current is suppressed at the end section of the second main electrode 15. Thus, this modified embodiment can suppress concentration of electric current just like the first embodiment illustrated in FIGS. 1 through 6.

Figure 9:
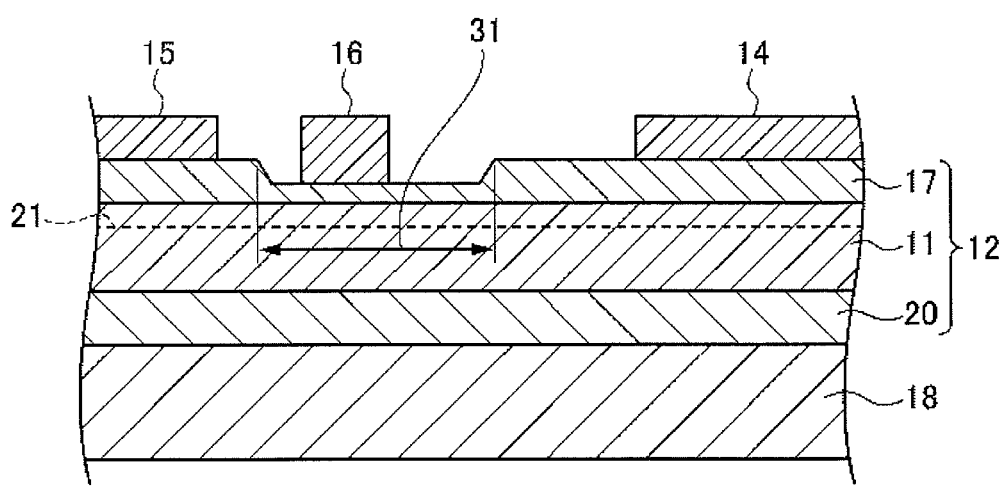
FIG. 9 is a schematic cross-sectional view of the semiconductor device according to a second embodiment of the present invention.

Now, the semiconductor device according to the second embodiment of the present invention will be described below. In the second embodiment, the electric current limiting section 31 is a part where the carrier concentration of the two-dimensional carrier gas layer is partially reduced between the first main electrode 14 and the arc-shaped region 15b of the second main electrode 15. FIG. 9 is a schematic cross-sectional view of the semiconductor device of the second embodiment of the present invention that corresponds to the cross-sectional view taken along line D-D in FIG. 7. The second embodiment of the present invention differs from the first embodiment in that the thickness of the carrier supply layer 17 is reduced around the control electrode 16 between the first main electrode 14 and the arc-shaped region 15b of the second main electrode 15 in the region for forming the electric current limiting section 31 if compared with the thickness of the carrier supply layer 17 of the other region as shown in FIG. 9. Otherwise, this embodiment is same as the nitride-based compound semiconductor device of the first embodiment illustrated in FIGS. 1 through 6. Therefore, the components same as those of the first embodiment are denoted by the same reference symbols and will not be described here repeatedly.

When manufacturing the nitride-based compound semiconductor device shown in FIG. 9, the carrier supply layer 17 is partially subjected to a recess etching process to make the carrier supply layer 17 thinner in the area where the gate electrode is to be formed by deposition in Step 2 of the above-described manufacturing method of the first embodiment. Thus, the carrier concentration of the 2 DEG 21 is reduced.

Thus, when a voltage is applied between the first main electrode 14 and the second main electrode 15 of the nitride-based compound semiconductor device according to the second embodiment of the present invention, 2 DEG 21 is formed in the region where no electric current limiting section 31 is formed so that consequently an electric current flows between the first main electrode 14 and the second main electrode 15. On the other hand, the electric current limiting section 31 is a high resistance region because the electron concentration of 2 DEG 21 is held low there so that consequently the electric current flowing through the electric current limiting section 31 is suppressed. As a result, concentration of electric current is suppressed at the end section 14a of the first main electrode 14. Thus, this embodiment can suppress concentration of electric current just like the first embodiment illustrated in FIGS. 1 through 6.

Now, the semiconductor device according to the third embodiment of the present invention will be described below. In the third embodiment, the electric current limiting section 32 is a part located right under the control electrode 16 between the first main electrode 14 and the arc-shaped region 15b of the second main electrode 15 where the carrier concentration of the two-dimensional carrier gas layer 21 is partially reduced. In the above-described arrangement, the electric current limiting section 32 is preferably a part where the carrier concentration of the two-dimensional carrier gas layer 21 is partially reduced by doping the compound semiconductor layer junctioned to the channel layer between the first main electrode and the arc-shaped region of the second main electrode with fluorine ions.

Figure 10:
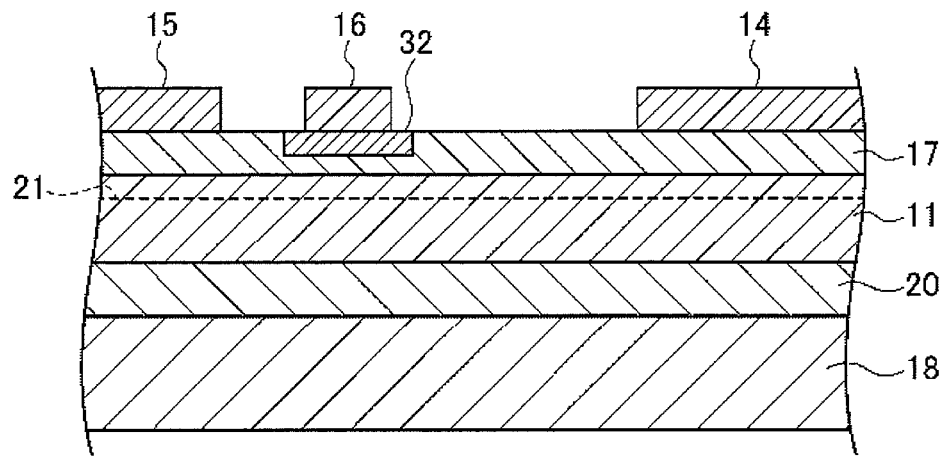
FIG. 10 is a schematic cross-sectional view of the semiconductor device according to a third embodiment of the present invention.

FIG. 10 is a schematic cross-sectional view of the semiconductor device of the third embodiment of the present invention that corresponds to the cross-sectional view taken along line D-D in FIG. 7. As seen from FIG. 10, the third embodiment of the present invention differs from the first embodiment illustrated in FIGS. 1 through 6 in that the electric current limiting section 32 is a part where the carrier concentration of the two-dimensional carrier gas layer is partially reduced by doping the compound semiconductor layer (carrier supply layer 17) junctioned to the channel layer 11 between the first main electrode and the arc-shaped region of the second main electrode with fluorine ions. Otherwise, this embodiment is same as the nitride-based compound semiconductor device of the first embodiment illustrated in FIGS. 1 through 6. Therefore, the components same as those of the first embodiment are denoted by the same reference symbols and will not be described here repeatedly.

When manufacturing the nitride-based compound semiconductor device as illustrated in FIG. 10, the carrier concentration of 2 DEG is reduced in the area of the carrier supply layer where the control electrode is to be formed by deposition by doping the carrier supply layer with fluorine ions there in the step corresponding to Step 2 of the method of manufacturing the first embodiment. The operation of fluorine ion doping can be conducted by way of a fluorine-based gas plasma process.

Thus, the nitride-based compound semiconductor device according to the third embodiment can suppress concentration of electric current just like the second embodiment.

Now, the semiconductor device according to the fourth embodiment of the present invention will be described below. In the fourth embodiment, the electric current limiting section 32 is a part located right under the control electrode 16 between the first main electrode 14 and the arc-shaped region 15b of the second main electrode 15 where the carrier concentration of the two-dimensional carrier gas layer 21 is partially reduced. With the above-described arrangement, preferably, the electric current limiting section 32 is a part where the carrier concentration of the two-dimensional carrier gas layer is partially reduced by making the compound semiconductor layer 33a junctioned to the channel layer 11 between the first main electrode 14 and the arc-shaped region 15b of the second main electrode 15 a p-type semiconductor layer.

Figure 11:
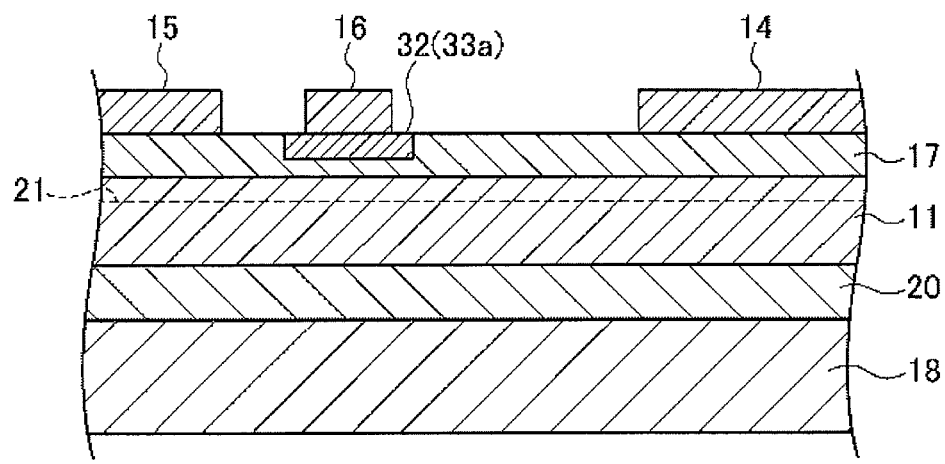
FIG. 11 is a schematic cross-sectional view of the semiconductor device according to a fourth embodiment of the present invention.
Figure 12:
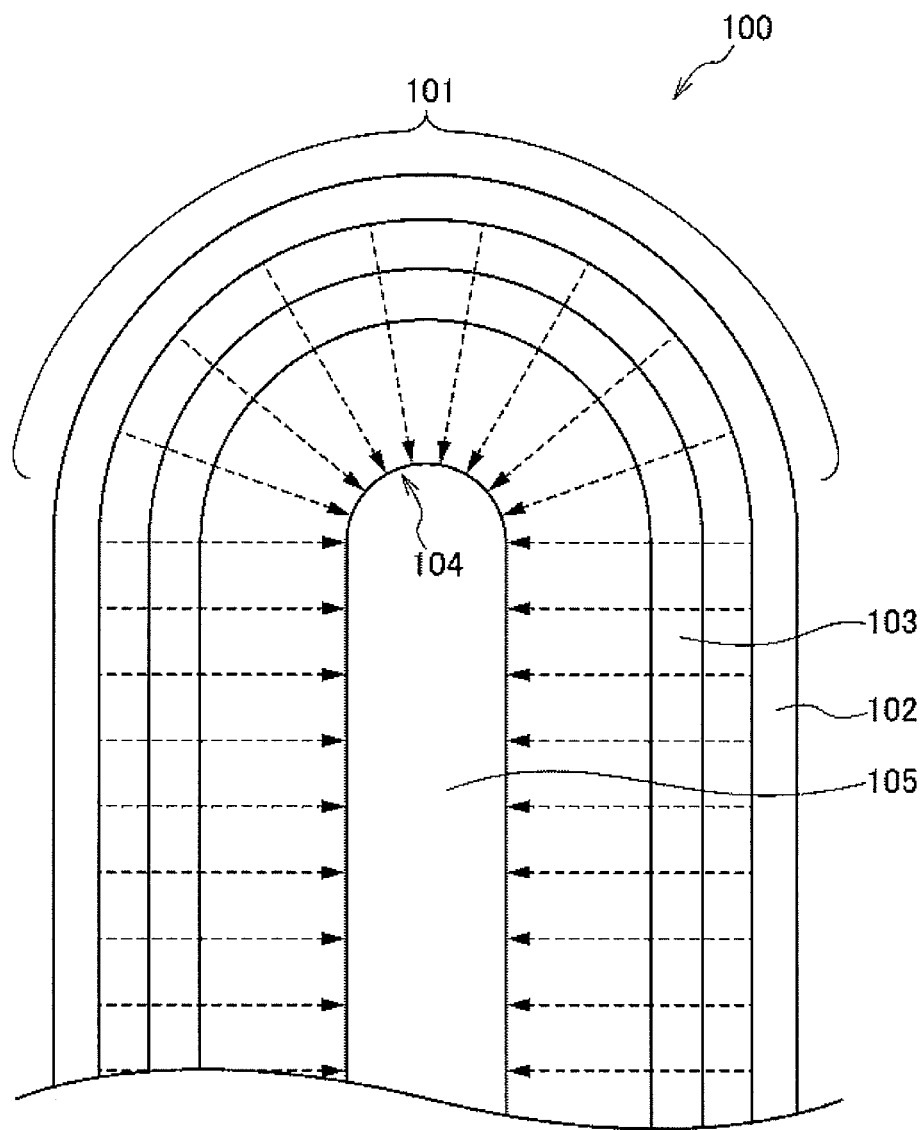
FIG. 12 is a schematic view of a known semiconductor device.

FIG. 11 is a schematic cross-sectional view of the semiconductor device of the fourth embodiment of the present invention that corresponds to the cross-sectional view taken along line D-D in FIG. 8. As seen from FIG. 11, the fourth embodiment differs from the first embodiment illustrated in FIGS. 1 through 6 in that the carrier concentration of the two-dimensional carrier gas layer 21 is partially reduced by forming a p-type semiconductor layer 33a on the channel layer 11 between the first main electrode 14 and the arc-shaped region 15b of the second main electrode 15. Otherwise, this embodiment is the same as the nitride-based compound semiconductor device of the first embodiment illustrated in FIGS. 1 through 6. Therefore, the components same as those of the first embodiment are denoted by the same reference symbols and will not be described here repeatedly.

When manufacturing the nitride-based compound semiconductor device as illustrated in FIG. 11, the carrier concentration of 2 DEG is reduced in the area of the carrier supply layer where the gate electrode is formed by deposition by doping a p-type impurity such as Mg by ion injection in Step 2.

Thus, the nitride-based compound semiconductor device of the fourth embodiment can suppress concentration of electric current just like the second embodiment.

While the electric current limiting section is arranged right under the control electrode in each of the above-described second through fourth embodiments, the present invention is by no means limited thereto and an electric current limiting section may be formed in a part other than right under the control electrode.

The first through fourth embodiments of the present invention are described above summarily in terms of configuration, shape, size and positional arrangement only to such an extent that the present invention is understandable and carried out. Additionally, the numerical values and the compositions (materials) of the components listed above are only shown as examples. Therefore, the present invention is by no means limited to the above-described embodiments, which may be modified, altered and/or combined in various different ways without departing from the technical spirit and scope of the present invention.

A semiconductor device according to the present invention can find applications in the field of power devices that are required to operate at a high frequency and with high breakdown voltage.

10 semiconductor device
11 channel layer
12 semiconductor layer
13 main surface
14 first main electrode (drain electrode)
15 second main electrode (source electrode)
16 control electrode
17 carrier supply layer
18 substrate
19 electric current limiting section
20 buffer layer
21 two-dimensional carrier gas layer

What is claimed is:

1. A semiconductor device comprising:
a substrate;
a compound semiconductor layer formed on the substrate and having a two-dimensional carrier gas layer based on a hetero-junction;
a first main electrode formed on the compound semiconductor layer;
a second main electrode formed on the compound semiconductor layer so as to surround the first main electrode in a plan view and having a linear region and an arc-shaped region; and
a control electrode formed between the first main electrode and the second main electrode on the compound semiconductor layer for controlling an electric current that flows between the first main electrode and the second main electrode by way of the two-dimensional carrier gas layer;
wherein,
first and second regions of the compound semiconductor layer are formed adjoining to each other along a direction perpendicular to a flowing direction of the current in the second region of the compound semiconductor layer in the plan view, each of the first and second regions having a different cross sectional structure between the first main electrode and the second main electrode from each other,
an electric current limiting section for limiting the electric current from flowing between the first main electrode and the arc-shaped region of the second main electrode is formed in the first region of the compound semiconductor layer, and
the electric current limiting section is not formed in the second region of the compound semiconductor layer.

2. The semiconductor device according to claim 1, wherein the electric current limiting section is formed locally in a portion where the electric current flowing between the first main electrode and the second main electrode is concentrated, in the plan view.

3. The semiconductor device according to claim 1, wherein a width of the electric current limiting section along a direction perpendicular to a flowing direction of the current in the adjoining second region, in the second main electrode side, is made wider, than that in the first main electrode side in the plan view.

4. The semiconductor device according to claim 1, wherein carrier concentration of the two-dimensional carrier gas layer formed between the first main electrode and a region around the arc-shaped region of the second main electrode is reduced locally in the plan view, in the electric current limiting section.

5. The semiconductor device according to claim 1, wherein carrier concentration of the two-dimensional carrier gas layer formed between the first main electrode and a region around the arc-shaped region of the second main electrode right under the control electrode is reduced locally in the plan view, in the electric current limiting section.

6. The semiconductor device according to claim 1, wherein the two-dimensional carrier gas layer is not formed in the electric current limiting section formed between the first main electrode and a region around the arc-shaped region of the second main electrode.

7. The semiconductor device according to claim 1, wherein the electric current does not flow between the first main electrode and the second main electrode in the first region, and the electric current flow between the first main electrode and the second main electrode in the second region, when a voltage is applied between the first main electrode and the second main electrode.

8. The semiconductor device according to claim 1, wherein the compound semiconductor layer includes a channel layer in which the two-dimensional carrier gas layer is formed, and a carrier supply layer formed on the channel layer to produce a hetero junction, and the carrier supply layer is thinned locally in the electric current limiting section formed between the first main electrode and the arc-shaped region of the second main electrode.

9. The semiconductor device according to claim 6, wherein the compound semiconductor layer junctioned to the channel layer is doped with fluorine, between the first main electrode and the arc-shaped region of the second main electrode, in the electric current limiting section.

10. The semiconductor device according to claim 6, wherein a p-type semiconductor layer is formed in the compound semiconductor layer junctioned to the channel layer between the first main electrode and the arc-shaped region of the second main electrode, in the electric current limiting section.

11. A semiconductor device comprising:
    a substrate;
    a compound semiconductor layer formed on the substrate and having a two-dimensional carrier gas layer based on a hetero junction;
    a first main electrode formed on the compound semiconductor layer;
    a second main electrode formed on the compound semiconductor layer so as to surround the first main electrode in a plan view and having a linear region and an arc-shaped region; and
    a control electrode formed between the first main electrode and the second main electrode on the compound semiconductor layer for controlling an electric current that flows between the first main electrode and the second main electrode by way of the two-dimensional carrier gas layer;
    wherein,
    first and second regions of the compound semiconductor layer are formed, each of the first and second regions having a different cross sectional structure between the first main electrode and the second main electrode from each other,
    an electric current limiting section for limiting the electric current from flowing between the first main electrode and the arc-shaped region of the second main electrode is formed in the first region of the compound semiconductor layer,
    the electric current limiting section is not formed in the second region of the compound semiconductor layer, and
    a width of the electric current limiting section along a direction perpendicular to a flowing direction of the current in the adjoining second region of the compound semiconductor layer, in the second main electrode side, is made wider than that in the first main electrode side.

12. The semiconductor device according to claim 11, wherein the first region and the second region are formed adjoining to each other along a direction perpendicular to a flowing direction of the current in the second region in the plan view.

13. The semiconductor device according to claim 11, wherein the electric current limiting section is formed locally in a portion where the electric current flowing between the first main electrode and the second main electrode is concentrated in the plan view.

14. The semiconductor device according to claim 11, wherein carrier concentration of the two-dimensional carrier gas layer formed between the first main electrode and a region around the arc-shaped region of the second main electrode is reduced locally in the plan view, in the electric current limiting section.

15. The semiconductor device according to claim 11, wherein carrier concentration of the two-dimensional carrier gas layer formed between the first main electrode and a region around the arc-shaped region of the second main electrode right under the control electrode is reduced locally in the plan view, in the electric current limiting section.

16. The semiconductor device according to claim 11, wherein the two-dimensional carrier gas layer is not formed in the electric current limiting section formed between the first main electrode and a region around the arc-shaped region of the second main electrode.

17. The semiconductor device according to claim 11, wherein the electric current does not flow between the first main electrode and the second main electrode in the first region, and the electric current flow between the first main electrode and the second main electrode in the second region, when a voltage is applied between the first main electrode and the second main electrode.

18. The semiconductor device according to claim 11, wherein the compound semiconductor layer includes a channel layer in which the two-dimensional carrier gas layer is formed, and a carrier supply layer formed on the channel layer to produce a hetero junction, and the carrier supply layer is thinned locally in the electric current limiting section formed between the first main electrode and the arc-shaped region of the second main electrode.

19. The semiconductor device according to claim 16, wherein the compound semiconductor layer junctioned to the channel layer is doped with fluorine, between the first main electrode and the arc-shaped region of the second main electrode, in the electric current limiting section.

20. The semiconductor device according to claim 16, wherein the electric current limiting section is a part, where a p-type semiconductor layer is formed in the compound semiconductor layer junctioned to the channel layer between the first main electrode and the arc-shaped region of the second main electrode.

* * * * *